340-552 SR

7/18/78 XR 4,101,791

United States Patent [19]

Atkins et al.

[11] 4,101,791

[45] Jul. 18, 1978

[54] DUAL CHANNEL WIDE-BAND FREQUENCY MODULATED KEYABLE CONTROL CIRCUIT AND KEYING CIRCUIT THEREFOR

[75] Inventors: Carl E. Atkins, Montclair; Francis A. McGuirk, Jr., Chatham, both of N.J.

[73] Assignee: Wagner Electric Corporation, Parsippany, N.J.

[21] Appl. No.: 736,374

[22] Filed: Oct. 28, 1976

Related U.S. Application Data

[62] Division of Ser. No. 660,116, Feb. 23, 1976, Pat. No. 4,045,778.

[51] Int. Cl.[2] .............................................. H03K 17/00

[52] U.S. Cl. .................................... 307/308; 307/361; 331/65; 340/552

[58] Field of Search ............... 307/361, 264, 308, 210, 307/233; 328/150; 331/65, 165, 117; 340/63, 171, 258 C

[56] References Cited

U.S. PATENT DOCUMENTS

| | | | |
|---|---|---|---|
| 3,248,560 | 4/1966 | Leonard | 307/351 |
| 3,696,253 | 10/1972 | Deisch | 307/351 |
| 3,723,967 | 3/1973 | Alkins et al. | 331/65 |

*Primary Examiner*—Stanley D. Miller, Jr.
*Assistant Examiner*—B. P. Davies
*Attorney, Agent, or Firm*—Eyre, Mann, Lucas & Just

[57] ABSTRACT

A dead-oscillator detector in a wide band frequency modulated keyable control circuit averts attempted actuation of the unlocking function by the coupling of untuned energy-absorbing material, such as iron, to a sensing coil. The energy absorbing material, being unresponsive to frequency, reduces the *rf* energy in the sensing coil approximately uniformly at all swept frequencies. The dead oscillator detector, lacking an *ac* component in the *rf* envelope over the entire frequency band, generates an inhibit signal which prevents the unlocking function. When a tuned circuit is properly coupled to the sensing coil, the resulting *ac* component in the *rf* envelope provides one required enable signal to unlock circuits.

3 Claims, 2 Drawing Figures

DUAL CHANNEL WIDE-BAND FREQUENCY MODULATED KEYABLE CONTROL CIRCUIT AND KEYING CIRCUIT THEREFOR

BACKGROUND OF THE INVENTION

This is a division of application Ser. No. 660,116, filed Feb. 23, 1976 now U.S. Pat. No. 4,045,778.

A number of patents disclose single-channel keyable control circuits. For example circuits disclosed in U.S. Pat. Nos. 3,624,415 and 3,628,099, both in the names of Carl E. Atkins and Arthur A. Cake, show keying circuits which require that the correct value of resistance in an external keying circuit be connected to actuate a keyable control circuit. In U.S. Pat. No. 3,723,967 in the names of Carl E. Atkins and Paul A. Carlson, a single channel inductively coupled tuned keying circuit absorbs energy from the radio frequency tank circuit of a free-running oscillator operating at the frequency to which the keying circuit is tuned. Radio frequency detection circuits detect the reduction in energy remaining in the oscillator and thereupon produce a control signal.

In U.S. Pat. No. 3,842,324 an external keying circuit includes a diode having a sharply variable junction capacitance with changes in diode bias as a component in a tuned circuit. When coupled to a keyable control circuit operating in the correct frequency range, absorbed rf energy causes rapid cyclic fluctuations in diode bias. The resulting rapid fluctuations in keying circuit resonant frequency alternately bring the keying circuit into and out of resonance with the rf frequency being generated. When in resonance, the keying circuit absorbs more rf energy from the rf oscillator than when out of resonance. The resulting amplitude modulation in the rf oscillator is detected to provide a control output signal.

Single-frequency keyable control systems suffer from the fact that a simple detection device discloses to a temperer the frequency at which he must operate to actuate the unlocking mechanism. In fact, a tuneable absorption wavemeter, which is the simplest type of frequency measuring device would itself activate the pure absorption unlocking mechanism in U.S. Pat. No. 3,723,967. A frequency system, operating at two or more frequencies simultaneously or in sequence, although increasing the difficulty, similarly suffers from the ability of a temperer to detect the operating frequencies.

SUMMARY OF THE INVENTION

The instant invention uses two or more swept *rf* oscillators gated into operation one at a time. One of the swept *rf* oscillators provides excitation signals to one or more sensing coils located at one type of load. Other swept *rf* oscillators provide excitation signals to other sensing coils for other types of loads. All of the swept oscillators receive a cyclically varying sweep voltage from a single sweep generator.

When a keying circuit, containing two or more resonant circuits tuned to specific keying frequencies within the oscillator sweep range, is coupled to one of the sensing coils, detection circuits within the keyable control circuit detect the depletion of *rf* energy from the oscillator at these specific keying frequencies. When *rf* energy depletion is simultaneously detected at all keying frequencies, an output circuit generates a control output signal. The absence of *rf* absorption at any one specific keying frequency is sufficient to cause the control output signal to be withheld.

Iron absorbs *rf* energy strongly and approximately equally over a wide frequency range. A piece of iron coupled to a sensing coil could thus significantly reduce the *rf* energy at all of the specific keying frequencies. A dead-oscillator detector averts spurious generation of a control output signal due to broad-band energy absorption or a dead oscillator. The dead-oscillator detector requires that significant *rf* energy be present at some frequencies within the *rf* sweep range before it will enable the control output signal to be generated.

DETAILED DESCRIPTION OF THE PREFERRED EMBODIMENT

Figure 1:
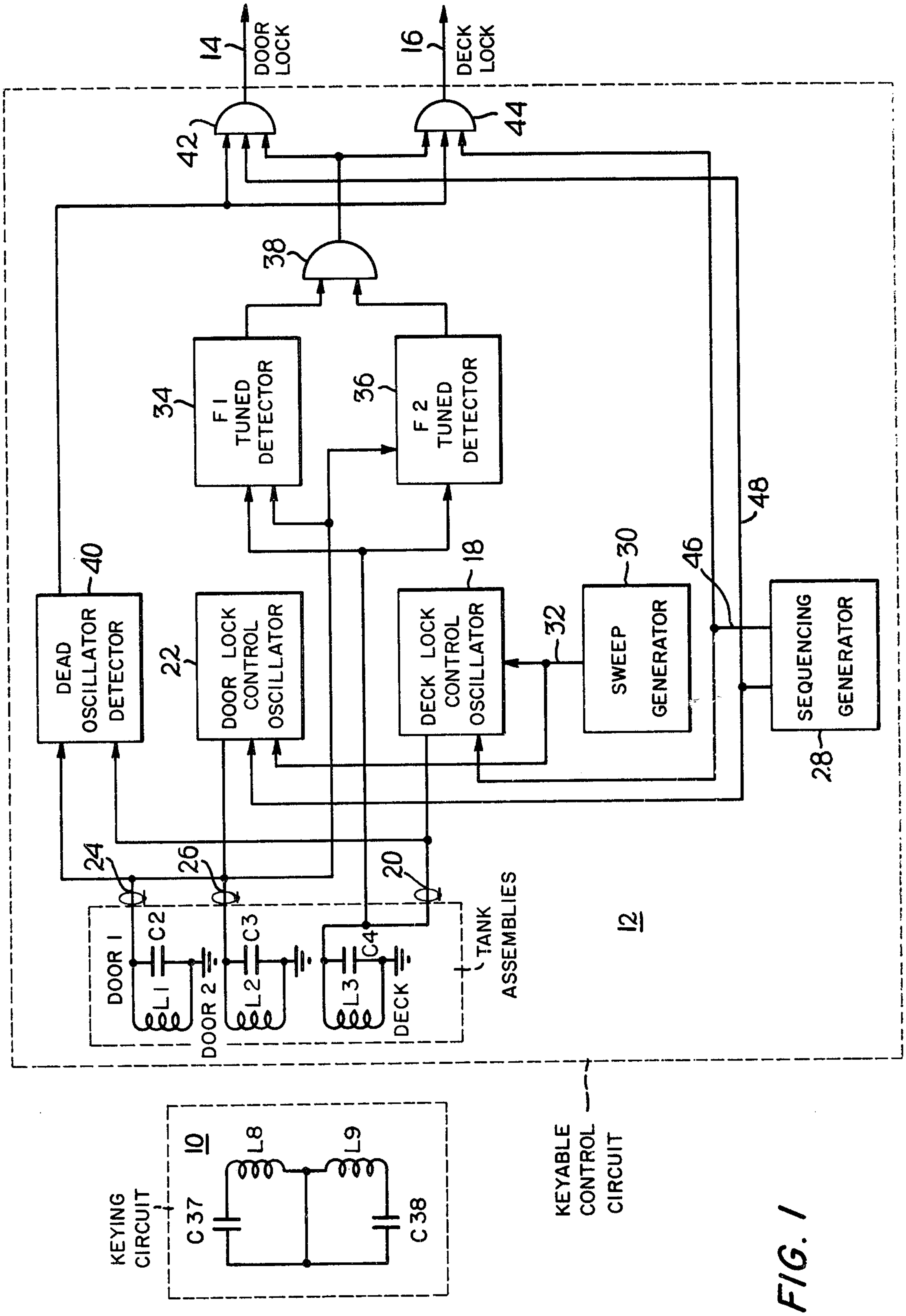
FIG. 1 shows a block diagram of one embodiment of the present invention.

Referring to the block diagram shown in FIG. 1, when a correct keying circuit, shown generally at 10, is brought into inductive coupling with one of the sensing coils L1, L2 or L3 of a keyable control circuit, shown generally at 12, the keyable control circuit 12 generates one or more lock control output signals 14, 16.

A swept deck lock control oscillator 18 feeds *rf* energy to its oscillator tank circuit composed of deck sensing coil L3 and capacitor C4. The deck oscillator tank circuit L3, C4 is located at the sensing location. A shielded cable 20 connects *rf* energy from the deck lock control oscillator 18 to the deck tank circuit L3, C4. The capacitance and inductance of the shielded cable 20 as well as stray coupling between the deck sensing coil L3 and nearby objects combine with the circuit values of L3 and C4 to determine the deck lock control oscillator 18 frequency.

A similar swept door lock control oscillator 22 feeds *rf* energy in parallel to first and second door tank circuits L1, C2 and L2, C3 located adjacent to first and second vehicle doors respectively. As in the deck arrangement previously described, the impedance of the shielded cables 24, 26 from the sensing locations to the oscillator 22 plus stray coupling combine to determine the door lock control oscillator 22 frequency.

A sequencing generator 28 alternately gates the two oscillators 18, 22 into operation. The sequencing generator 28 also performs output gating as will be explained later.

A sweep generator 30 provides a sweep voltage signal 32 in parallel to the swept oscillators 18, 22. The sweep voltage is preferably of triangular or sawtooth waveform but could be of sinusoidal or other waveform. The applied sweep voltage signal 32 causes the frequency of whichever oscillator is gated on at any instant to vary in step with the sweep voltage signal 32. The frequency sweep is very wide compared to the mean oscillator frequency. For example, and not as a limitation, a frequency sweep from 6 to 7 megahertz has been found feasible with the practical circuit component specified later.

A first detector 34 tuned to a first frequency F1 receives inputs from all tank circuits. A similar second detector 36 tuned to a second frequency F2 also receives inputs from all tank circuits.

For the purpose of the discussion which follows, assume that the sequencing generator 28 has enabled the deck lock control oscillator 18. The events leading to the generation of the deck lock control signal 16 will be described. Since operation of the door lock control oscillator 22 is essentially similar, its operation will not be described in detail.

The deck lock control oscillator 18 provides a widely swept frequency signal to the deck sensing coil L3 resonated by parallel capacitor C4. A sample of the *rf* energy in the deck lock control oscillator 18 is connected in parallel to first detector 34 and second detector 36.

The keying circuit 10 consists of two LC tuned circuits integrated into a single electrical and mechanical assembly. A first LC tuned circuit in the keying circuit 10, comprised of inductor L8 and capacitor C37, is resonant at a different frequency from a second LC tuned circuit comprised of inductor L9 and capacitor C38. Both LC tuned circuits are resonant at frequencies within the sweep range of the deck lock control oscillator 18. Whenever the *rf* frequency is swept past the resonant frequency of one of the tuned circuits in the keying circuit 10, the tuned circuit absorbs a greater amount of *rf* energy than at other times. If the frequency at which this increased absorption occurs coincides with the frequency to which either tuned detectors 34 or 36 is tuned, the respective tuned detector 34 or 36 enables one input of coincidence gate 38. If the resonant frequency of the second tuned circuit in the keying circuit 10 coincides with the frequency to which the second tuned detector 34, 36 is tuned, the respective tuned detector 34 or 36 enables the second input to coincidence gate 38. Both inputs to coincidence gate 38 being enabled by the presence of correctly tuned keying circuit 10, the coincidence gate 38 connects an enable signal in parallel to one input of each of the two output gates 42, 44.

A dead oscillator detector 40 receives samples of the *rf* energy from both oscillators 18, 22. If an oscillator is dead, or if its energy is substantially absorbed over the entire sweep frequency range by an absorbent material such as iron, the dead oscillator detector 40 provides an inhibit signal to one input of each of the two output gates 42, 44. If the deck lock control oscillator 18, which is the oscillator gated on in this discussion, contains substantially full *rf* energy except at a few resonant absorption points, the dead oscillator detector 40 provides an enable signal to one input of the two output gates 42, 44.

The third input to output gate 44 is enabled at this time by the signal from the sequencing generator 28 which enables the deck lock control oscillator 18. For example, when the deck enable signal 46 is connected to deck lock control oscillator 18, it is also connected to the third input of deck output gate 44. The deck output gate 44 produces a deck unlock signal 16 for connection to an electrically operated deck lock (not shown). At this time, the door output gate 42 is inhibited by the alternative output of the sequencing generator 28. Thus, lock control at this time is restricted to the deck unlock signal 16.

The preceding completes the single-channel functional description of the deck-lock-control portion of the system. The following paragraph outlines the differences in the door-lock-control portion of the system.

At the next alternation of the sequencing generator 28 output, the deck signal 46 is replaced by an inhibit signal and a door enable signal 48 is connected to the door lock control oscillator 22 and to the door output gate 42. The first door control tank circuit L1-C2 is located in the vicinity of one door; a second door control tank circuit L2-C3 is located in the vicinity of a second door. Both door control tank circuits are fed swept *rf* energy in parallel by the deck lock control oscillator 18. When a correct keying circuit 10 is coupled to either door control tank circuit L1-C2 or L2-C3, radio frequency energy is absorbed at two keying frequencies as previously described. The first and second detectors 34 and 36 detect the energy depletion at the keying frequencies, enable door output gate 42, and produce a door lock control output 14 in a manner analogous to the production of the deck unlock output 16 previously described.

Figure 2:
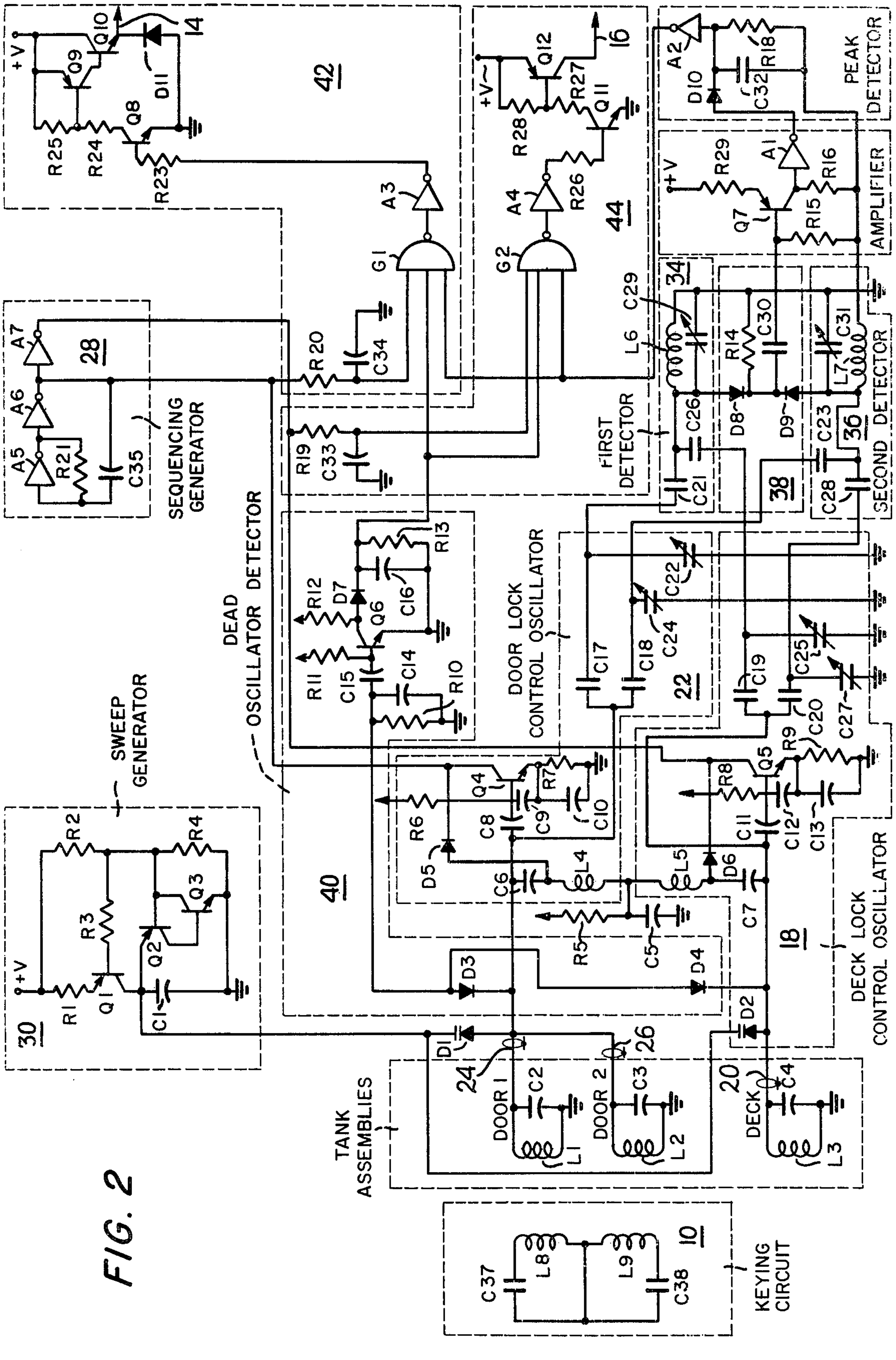
FIG. 2 contains a schematic diagram of the embodiment shown in FIG. 1.

Detailed functioning of the system is described with reference to the schematic diagram shown in FIG. 2. Each function previously identified is boxed and identically numbered in this drawing. The deck lock control oscillator 18, with its associated circuits is identical to the door lock control oscillator 22 with its associated circuits. Consequently, only the operation of the deck lock control circuits will be described in detail. Functional differences between the two control circuits will be described at the end of the detailed single-channel description.

The deck lock control oscillator 18 is an oscillator made up of transistor Q5 and associated components. A capacitive divider made up of capacitors C12 and C13 provide positive feedback from emitter to base of Q5 to sustain oscillation.

When the positive gating voltage from the sequencing generator 28 appears at the collector of Q5, a ground inhibit signal is simultaneously connected to the collector of Q4 in the door lock control oscillator 22. Current through R5 and L4 flows through forward-biased *rf* bypass diode D5 in the door lock control oscillator 22. Forward biases diode D5 provides a short-circuit path to ground for *rf* energy from the door oscillator tank circuits through bypass capacitor C6. This *rf* bypass effectively places an *rf* ground at the junction of varactor diode D1 and the two door tank circuits L1, C2 and L2, C3. This *rf* bypass prevents the door tank circuits from interacting with the deck lock control oscillator 18 during its operation. The positive gating voltage at the collector of Q5 back-biases *rf* bypass diode D6 in the deck lock control oscillator 18. With *rf* bypass diode D6 back biased, bypass capacitor C7 is ineffective to shunt *rf* energy to ground. Rf choke L5 isolates the *rf* in Q5 from the bias voltage source. Thus Q5 is enabled to generate *rf* energy.

The sequencing generator 28 is made up of amplifiers A5, A6 and A7 with frequency-determining feedback components R21 and C35. The output of amplifier A6 is a square wave alternating between zero volts and positive voltage. The output of amplifier A6 is connected to door output gate 42 and to door lock control oscillator 22. Inverter amplifier A7, also receiving the output of amplifier A6, provides an output which is the inverse of its input. For example, when the output of amplifier A6 is zero volts, the output of inverter amplifier A7 is positive, and vice versa. The output of inverter amplifier A7 is connected to deck output gate 44 and to deck lock control oscillator 18. It will be evident that, whenever the deck lock control oscillator 18 and its associated deck output gate 44 are enabled by the positive output of inverter A7, the zero output of amplifier A6 must inhibit both door lock control oscillator 22 and its associated door output gate 42.

The positive voltage at the collector of oscillator transistor Q5 back biases diode D6 thus removing the ac short circuit between base and collector of Q5 through C7 and previously conducting diode D6. Oscillator transistor Q5 begins generating *rf* energy at a frequency determined by its tank circuit L3, C4, cable 20 impedance, stray capacitance, and the sweep voltage across varactor diode D2 generated by sweep generator 30.

The sweep generator consists of an integrating capacitor C1, a charging current source transistor Q1 and a switch Q2, Q3. Assume initially that switch transistors Q2 and Q3 are turned off and integrating capacitor C1 is discharged. The voltage divider consisting of resistors R2 and R4 holds the base of switch transistor Q2 at approximately 2.5 volts. The emitter of Q2 is initially at zero volts due to the discharged condition of C1. The emitter-base junction of Q2 is consequently held in the back-biased condition as long as its base voltage remains more positive than its emitter voltage.

Integrating capacitor C1 begins to charge from the positive supply through limiting resistor R1 and the emitter-collector junction of current supply transistor Q1. The approximately linear voltage increase in integrating capacitor C1 is connected in parallel to sweep varactor diodes D1 and D2 in the tank circuits of door lock control oscillator 22 and deck lock control oscillator 18, respectively. When the voltage across the integrating capacitor reaches 3.15 volts (2.5 volts bias + 0.65 volt base-emitter drop), transistor Q2 is turned on. The positive voltage now appearing at the base of transistor Q3 causes Q3 to also turn on. The current in the emitter-collector path of Q3 increases the voltage drop across resistor R2 to approximately 7.35 volts. This voltage drop holds the base of Q2 at 0.65 volts as long as current continues to flow in Q3. Integrating capacitor C1 is rapidly discharged through the emitter-collector junction of Q2 and the base-emitter junction of Q3. As soon as the charge in integrating capacitor C1 is depleted to approximately zero volts, the emitter of Q2 no longer being more positive than its base causes Q2 to turn off. This, in turn, removes the control voltage from the base of Q3. Q3 consequently turns off. The current through Q3 now being terminated cause the junction of voltage divider R2 and R4 to again rise to 2.5 volts. The charging of integrating capacitor C1 resumes. This continuing pattern of approximately linear charge followed by relatively instantaneous discharge produces a sawtooth waveform which is used to sweep the oscillator 18 or 22 frequency.

Varactor diode D2 is connected in series to ground with integrating capacitor C1. The varactor/integrator combination, D1/C1, is connected in parallel with the deck tank circuit L3, C4. Changes in the junction capacitance of varactor diode D2 are therefore effective to vary the frequency of the deck lock control oscillator 18.

A sample of the *rf* energy in the deck lock control oscillator 18, taken at the junction of capacitors C7 and C11, is connected to a first capacitive voltage divide consisting of fixed capacitor C19 and variable capacitor C25, and to a second capacitive voltage divider consisting of fixed capacitor C20 and variable capacitor C27. The two capacitive voltage dividers are adjusted after installation to compensate for the fact that the amplitude of the *rf* energy generated by Q5 varies across the sweep frequency range. Typically, *rf* energy is lower at the low-frequency end of the sweep. When correctly adjusted, the *ac* signal coupled to first detector 34 at frequency F1 equals the *ac* signal coupled to second detector 38 at frequency F2. In addition, adjustment of the capacitive voltage dividers from deck lock control oscillator 18 plus a corresponding pair of capacitive voltage dividers C18, C24 and C17, C2 from door lock control oscillator 22 compensate for *rf* energy differences between the two oscillators.

Within first detector 34, capacitor C26 couples the *rf* energy from the junction at capacitive voltage divider C19, C25 to a sharply parallel-resonant circuit comprised of inductor L6 and capacitor C29. This resonant circuit is tuned to the first keying frequency. In the absence of a keying circuit 10, each time the oscillator frequency is swept past the first keying frequency, the *rf* voltage across L6 and C29 is increased by the Q of the resonant circuit. An *rf* voltage spike is thus generated each time the frequency is swept past the first keying frequency. This *rf* voltage spike is detected by diode D8 which connects the envelope of the *rf* spike to the base of amplifier transistor Q7. The positive base voltage turns off transistor Q7. The resulting low input to inverter amplifier A1 causes inverter amplifier A1 to generate a sequence of positive output pulses. Diode D10 feeds the positive pulses into peak-detector capacitor C32. The time constant of peak-detector capacitor C32 and bleeder resistor R18 is such that if one *rf* spike is detected per frequency sweep, peak-detector capacitor C32 remains sufficiently charged to maintain the output of inverter amplifier A2 at approximately zero volts. The resulting zero-volts output of inverter A2 inhibits one input of each of output gates 42 and 44. Thus if only the circuit tuned to the first keying frequency in keying circuit 10 is absent, the result is complete denial of a control output regardless the presence or absence of other tuned circuits in the keying circuit 10.

When a resonant circuit C37, L8 or C38, L9, tuned to the first keying frequency, is inductively coupled to the deck sensing coil L3, the *rf* energy at the first keying frequency is depleted by absorption in the keying circuit. Thus, as the oscillator frequency is swept past the first keying frequency, the parallel-resonant circuit C29, L6 in the first detector 34 finds insufficient *rf* energy with which to form an *rf* spike. Consequently, no energy is stored in peak-detector capacitor C32 as the result of an *rf* spike at frequency F1.

Second detector 36 operates in the same fashion as just described for first detector 34. If a properly tuned circuit in the keying circuit also absorbs energy at frequency F2, the *rf* spike otherwise generated by L7 and C31 is suppressed in the same manner as described for the suppression of the F1 spike. With both *rf* spikes suppressed, peak-detector capacitor C32 discharges through bleeder resistor R18. As soon as the voltage across peak-detector capacitor C32 approaches zero, the output of inverter amplifier A2 switches from zero volts to a positive enable signal. This positive enable signal enables one input of door output gates 42 and deck output gate 44.

A second input to the deck output gate 44 is provided by a signal from dead oscillator detector 40 which is generated as described in the following sentence. A sample of the *rf* energy in the deck lock control oscillator 18 is rectified in diode D4 and connected as a sequence of negative half cycles through capacitor C15 to the base of transistor Q6. With the values given for capacitor C15 and C14 and resistor R10, transistor Q6 is unable to respond at the *rf* frequency. If no tuned circuit is coupled to the sensing coil L3, or if deck lock control oscillator 18 is dead, transistor Q6 produces a null output. Capacitor C16, failing to receive charging signals from transistor Q6 remains discharged by bleeder resistor R13. The resulting zero-volt signal inhibits one input of door output gate 42 and deck output gate 44. Thus, if an alternating component in the *rf* envelope is not produced by the presence of a tuned keying circuit, the output gates 42, 44 remain inhibited. The absence of the alternating component in the *rf* envelope may be due to the absence of a tuned circuit, the nonfunctioning of the oscillator, or to the presence of an absorber, such as iron which absorbs the *rf* energy at all frequencies.

If any resonant circuit, tuned within the sweep range of the functioning deck lock control oscillator 18 is coupled to the sensing coil (whether or not the resonant frequency matches frequency F1 or F2), the resulting amplitude-modulated component in the *rf* envelope causes transistor Q6, normally turned on, to be turned off momentarily each time the oscillator frequency sweeps past the frequency of the external resonant circuit. The resulting positive alternations in the output of transistor Q6 are connected through diode D7 to capacitor C16. Capacitor C16 becomes charged to approximately the peak of the positive-going signal at the collector of transistor Q6. The resistance of bleeder resistor R13 is so high that, as long as positive charging signals occur at the sweep rate, it does not significantly deplete the charge in capacitor C16. The positive voltage stored in C15 provides the enable signal which enables the second input to deck output gate 44.

The third input to deck output gate 44 is enabled, as previously described, by the high output assumed at this time from inverter A7 in the sequencing generator 28. A leading-edge delay circuit composed of resistor R19 and capacitor C33 on the input to deck output gate 44 applies a few milliseconds delay to the onset of the gating signal from sequencing generator 28 to ensure that the peak-detector capacitor C32 is given time to charge following the end of the preceding door cycle. Without the slight delay imposed in this way, if a door control signal is properly generated in the preceding time period, the initiation of the deck control time period finds capacitor C32 fully discharged. Since it takes a few frequency sweeps to fully charge capacitor C32, an immediate application of the sequence generator 28 signal to the deck output gate 44 would produce an undesired unlock signal. The delay imposed by the leading-edge delay circuit R19, C33 avoids such undesired unlock signals.

When all inputs to NAND gate G2 in deck output gate 44 are enabled, the resulting low output is amplified and inverted in inverter A4 and connected through R26 to the base of output control transistor Q11. Output control transistor Q11 is turned on by the positive voltage at its base. The resulting reduced voltage at the base of output transistor Q12 turns output transistor Q12 on. The emitter-collector junction of output transistor Q12 provides a positive control output signal 16 for operation of the deck lock (not shown).

The preceding completes the detailed single-channel description of the deck lock control portion of the system. The following paragraphs detail the differences to be found in the operation of the door lock control portion of the system. Description of those functions which are the same in the two portions of the system is omitted.

At the end of the deck control time period, the outputs of the sequencing generator 28 are reversed. The positive enable signal, previously connected from inverter A7 in the sequencing generator 28 to transistor A5, is replaced by a ground signal. The ground signal previously connected from amplifier A6 in the sequencing generator 28 to transistor Q4, is replaced by a positive enable signal. The ground signal at the collector of Q5 turns off the deck lock control oscillator 18 and causes *rf* bypass diode D6 to become forward biased. Forward-biased diode D6 acts as an *rf* short from the deck tank circuit L3, C4 through bypass capacitor C7 to ground. This *rf* bypass path eliminates interaction between the deck control tank circuit L3, C4 and the active door lock control channel.

The door lock control channel contains two tank circuits L1, C2 and L2, C3 which are fed *rf* energy in parallel rather than the single tank circuit L3, C4 as described for the deck lock control channel. Although circuit values are adjusted slightly to ensure that the full frequency sweep is attainable, the operation of the front end of the door lock control channel is otherwise identical to the deck lock control channel.

The door output gate 42 is similar to the deck output gate 44 except for the substitution of a darlington output amplifier, Q9, Q10, in place of the single-transistor output amplifier Q12 used in the deck output gate 44. The higher gain obtainable with the darlington output amplifier Q9, Q10 is necessary to produce a door lock control signal 14 capable of simultaneously operating the locks on both doors instead of the single-lock operation required by the deck lock control channel.

The following list of circuit component values and identities are illustrative of one practical embodiment of the invention. It will be readily evident to one skilled in the art that different component values or arrangements will produce equivalently functioning systems without departing from the teachings of the invention.

| Resistances (ohms) | | Capacitances (microfarads) | | Transistors | |
|---|---|---|---|---|---|
| R1 | 22K | C1 | .01 | Q1 | 2N4248 |
| R2 | 22K | C2 | 20–500 pf (shielded cable capacitance) | Q2 | 2N4248 |
| R3 | 1M | C3 | " | Q3 | 2N5132 |
| R4 | 10K | C4 | " | Q4 | 2N5132 |
| R5 | 33K | C5 | .01 | Q5 | 2N5132 |
| R6 | 1.5M | C6 | .01 | Q6 | 2N5132 |
| R7 | 10K | C7 | .01 | Q7 | 2N4248 |
| R8 | 1.5M | C8 | 200pf | Q8 | 2N3567 |
| R9 | 10K | C9 | 200pf | Q9 | MJE371 |
| R10 | 470K | C10 | .2pf | Q10 | 2N3055 |
| R11 | 3.3M | C11 | .2pf | Q11 | 2N3567 |
| R12 | 220K | C12 | .2pf | Q12 | MJE371 |
| R13 | 10M | C13 | .2pf | Integrated Circuits | |
| R14 | 270K | C14 | .001 | | |
| R15 | 10M | C15 | 470pf | A1 | CD4009AE |
| R16 | 470K | C16 | .027 | A2 | CE4009AE |
| R17 | 10K | C17 | 15pf | A3 | CD4009AE |
| R18 | 1.5M | C18 | 15pf | A4 | CD4009AE |
| R19 | 1M | C19 | 15pf | A5 | CD4009AE |
| R20 | 1M | C20 | 15pf | A6 | CD4009AE |
| R21 | 1.5M | C21 | 10pf | A7 | CD4023AE |
| R23 | 10K | C22 | 5–30 pf var | | |
| | | | | Gates | |
| R24 | 470 | C23 | 10pf | G1 | CD4023AE |
| R25 | 10K | C24 | 5–30pf var | G2 | CD4023AE |
| R26 | 10K | C25 | 5–30pf var | | |
| | | | | Diodes | |
| R27 | 470 | C26 | 10pf | D1 | MV1401 |
| R28 | 10K | C27 | 5–30pf var | D2 | MV1401 |
| R29 | 10K | C28 | 10pf | D3 | IN4148 |
| | | C29 | 10–180pf var | D4 | IN4148 |
| | | C30 | .0047 | D5 | IN4148 |
| | | C31 | 10–180pf var | D6 | IN4148 |
| | | C32 | .068 | D7 | IN4148 |
| | | C33 | .01 | D8 | IN4148 |

-continued

| | | | | |
|---|---|---|---|---|
| | C34 | .01 | D9 | IN4148 |
| | C35 | .22 | D10 | IN4148 |
| | C36 | not used | D11 | IN5060 |
| | C37 | 56pf | | |
| | C38 | 50pf | | |
| Inductances (microhenry) | | | | |
| L1 39 | | | | |
| L2 39 | | | | |
| L3 39 | | | | |
| L4 1500 | | | | |
| L5 39 | | | | |
| L6 5 | | | | |
| L7 5 | | | | |
| L8 10.5 | | | | |
| L9 10.5 | | | | |

It will be understood that the claims are intended to cover all changes and modifications of the preferred embodiments of the invention, herein chosen for the purpose of illustration which do not constitute departures from the spirit and scope of the invention.

What is claimed is:

1. In an electronically keyable control system of the type in which swept *rf* energy from a swept *rf* oscillator is connected to at least one sensing location and in which at least one keying signal is generated in response to a predetermined condition of physical proximity of a keying circuit to said sensing location, said keying circuit being resonant at at least one frequency within the sweep range of said swept *rf* oscillator, the improvement of a dead oscillator detector comprising:

(a) means for detecting a sample of the swept *rf* energy at at least one of said at least one sensing location;

(b) means for generating a constant enable signal when said sample of swept *rf* energy contains a predetermined modulation;

(c) said means for generating a constant enable signal being operative to generate a constant inhibit signal during the absence of said modulation; and (d) an AND gate receiving said enable and inhibit signals at one of its inputs and said keying signal at another of its inputs.

2. The dead oscillator detector recited in claim 1 wherein said means for detecting comprises a diode connected to said swept *rf* energy.

3. The dead oscillator detector recited in claim 2 wherein said means for generating comprises:

(a) a parallel combination of a resistor and a capacitor connected to the anode terminal of said diode, the other end of said parallel combination being connected to ground;

(b) a coupling capacitor having a first lead conncted to the anode terminal of said diode;

(c) a detector transistor having its base connected to the second lead of said coupling capacitor; and (d) a peak detector comprising a series diode receiving at its anode terminal the output of said detector transistor and a parallel combination of a resistor and capacitor connected between the cathode terminal of said diode and ground.

* * * * *